United States Patent [19]

Wittmaack

[11] 4,132,892

[45] Jan. 2, 1979

[54] RASTER SCANNING ION MICROSCOPE WITH QUADRUPOLE MASS FILTER

[75] Inventor: Klaus Wittmaack, Munich, Germany

[73] Assignee: Gesellschaft für Strahlen- und Umweltforschung mbH München, Nuremberg, Germany

[21] Appl. No.: 701,683

[22] Filed: Jul. 1, 1976

[30] Foreign Application Priority Data

Dec. 13, 1975 [DE] Fed. Rep. of Germany ....... 2556291

[51] Int. Cl.$^2$ ................... G01N 23/00; H01J 37/26
[52] U.S. Cl. .................................. 250/309; 250/292
[58] Field of Search ............... 250/309, 305, 396, 397, 250/398, 292, 296, 310, 311; 313/361, 359

[56] References Cited

U.S. PATENT DOCUMENTS

| 3,686,499 | 8/1972 | Omura et al. | 250/309 |
| 3,859,226 | 1/1975 | Schillalies | 250/309 |
| 3,894,233 | 7/1975 | Tamura | 250/309 |
| 3,986,025 | 10/1976 | Fujiwara et al. | 250/309 |

*Primary Examiner*—Bruce C. Anderson
*Attorney, Agent, or Firm*—Spencer & Kaye

[57] ABSTRACT

A raster scanning ion microscope for determining, with a large field of view, the lateral distribution of elements, isotopes and compounds at the surface and in the bulk of solid specimens and for displaying the surface topography of the sample. The scanning ion microscope consists of an ion gun to produce a primary ion beam, a means to focus and raster scan the primary ion beam over the surface of the specimen, a means to form a beam of secondary ions out of all particles sputtered from the specimen, an energy analyzer and a mass spectrometer for secondary ion analysis and a means for optimum transport of the secondary ions from the specimen to the mass spectrometer. Use of a quadrupole mass filter as a mass analyzer reduces restrictions usually faced with magnetic type mass analyzer and allows imaging of the specimen with a large field of view. Moreover non-normal secondary ion extraction and/or non-normal primary ion incidence in combination with low secondary ion extraction voltages result in the capability of the instrument of displaying the surface topography of the specimen.

5 Claims, 5 Drawing Figures

Steel gauze

Secondary ion extraction $^{56}Fe^+$ image

RASTER SCANNING ION MICROSCOPE WITH QUADRUPOLE MASS FILTER

BACKGROUND OF THE INVENTION

The invention relates to a new type of raster scanning ion microscopes which provide both a determination of the lateral distribution of elements (isotopes) and compounds over large areas of the surface of specimens as well as a display of the surface topography.

In the invention the method of secondary ion mass spectrometry is used for analysis. This implies sputter erosion of the specimen by bombardment with primary ions at an energy of a few keV. Part of the atomic or molecular species emitted from the target is ionized (secondary ions) and thus can be analyzed quantitatively in a mass spectrometer. Presently used magnetic type secondary ion mass spectrometers of sophisticated design allow a determination of the lateral distribution of elements and compounds over small areas of the specimen surface, either by direct ion imaging as described by R. Castaing and G. Slodzian in Journal de Microscopie 1 (1962) 395 or by raster scanning ion imaging as reported by H. Liebl in the Journal of Applied Physics 38 (1967) 5277. The present state of the art has been reviewed by H. Liebl in the Journal of Physics E. Scientific Instruments 8 (−1975) 797.

In raster scanning ion microscopy the primary ion beam is focused to a microspot by use of a suitable lens and raster scanned over the specimen surface by means of two pairs of deflection plates. The secondary ions produced are analyzed by a mass spectrometer and recorded by a suitable detector system. The mass spectrometer is tuned to the desired mass number and the amplified output signal of the multiplier is used to modulate the beam intensity (z axis) in an oscilloscope whose x,y deflection is synchronized with the primary beam raster. The intensity distribution on the oscilloscope thus reflects the lateral concentration distribution of the element or compound considered. Moreover, continuous sputtering and repeated imaging provides a three-dimensional characterization of one or more elements in the sample. Instead of an oscilloscope other types of recorders such as multichannel analyzers may be used for recording.

Magnetic type secondary ion microscopes suffer from at least three drawbacks, (i) the surface area to be imaged or the field of view is restricted to a diameter or edge width of 0.4 mm at the most, (ii) the depth of focus is small, and (iii) the surface topography is not displayed. One of the reasons for these disadvantages is due to the fact that magnetic type mass spectrometers provide sufficient mass resolution only if the object and image size are small.

SUMMARY OF THE INVENTION

It is an object of this invention to provide a raster scanning ion microscope which allows, with improved depth of focus, large area microanalysis as well as a display of the surface topography.

This and other objects of the invention are achieved by employing a quadrupole filter as the mass spectrometer in a device of the type described above. In preferred embodiments of the invention electrostatic immersion and einzel lenses are introduced between specimen and energy analyzer as well as between energy analyzer and quadrupole filter. By use of the immersion lenses the secondary ions produced can be accelerated and focused before entering the energy analyzer and decelerated behind the energy analyzer to acquire the energy suitable for mass analysis in the quadrupole filter. The acceleration-deceleration operation mode results in a pronounced gain in intensity in the mass spectrum of secondary ions. In the raster scanning ion microscope according to the invention the secondary ions can be extracted by a voltage of less than 1 kV, and an acceleration voltage of only 100 V is sufficient to produce saturation in the peak intensities. Moreover one finds that with respect to the mass spectrometer axis and parallel to the primary beam axis, the position of the specimen may be varied by a large amount, i.e., by about ± 2 mm, with only negligible loss in intensity. In addition the detectability is nearly constant over a diameter of about 2 mm normal to the primary beam axis. Variations of the position of the secondary ion source within these limits have no detectable effect on the mass resolution of the spectrometer.

Ion images produced with a scanning ion microscope according to the invention are characterized by a large depth of focus which is due to the fact mentioned above that the signal height is not sensitive to slight variations of the sample position. For the same reason the areas to be displayed in one image can be much larger with the invention than with ion microscopes of the art. Finally the images produced with the invention exhibit a peculiarity which has been known up to now only from raster scanning *electron* microscopes, i.e., the images display the surface topography of the specimen. Unlike electron microscopes, however, ion microscopes according to the invention provide not only a display of the surface topography but also mass analysis of the instantaneous specimen surface.

There are two effects which result in the capability of the invention of displaying the surface topography of a specimen, (i) shadowing in analysis of the secondary ions emitted non-normally to the macroscopic surface plane and (ii) dependence of the most probable angle of secondary ion emission upon the microscopic angle of incidence of the primary ions. Ion optical arguments support the idea that the effects are the more pronounced the smaller the secondary ion acceleration voltage is.

BRIEF DESCRIPTION OF THE DRAWING

The invention will be more fully understood from the following detailed description with reference to the drawings, wherein.

DESCRIPTION OF THE PREFERRED EMBODIMENTS

Figure 1:
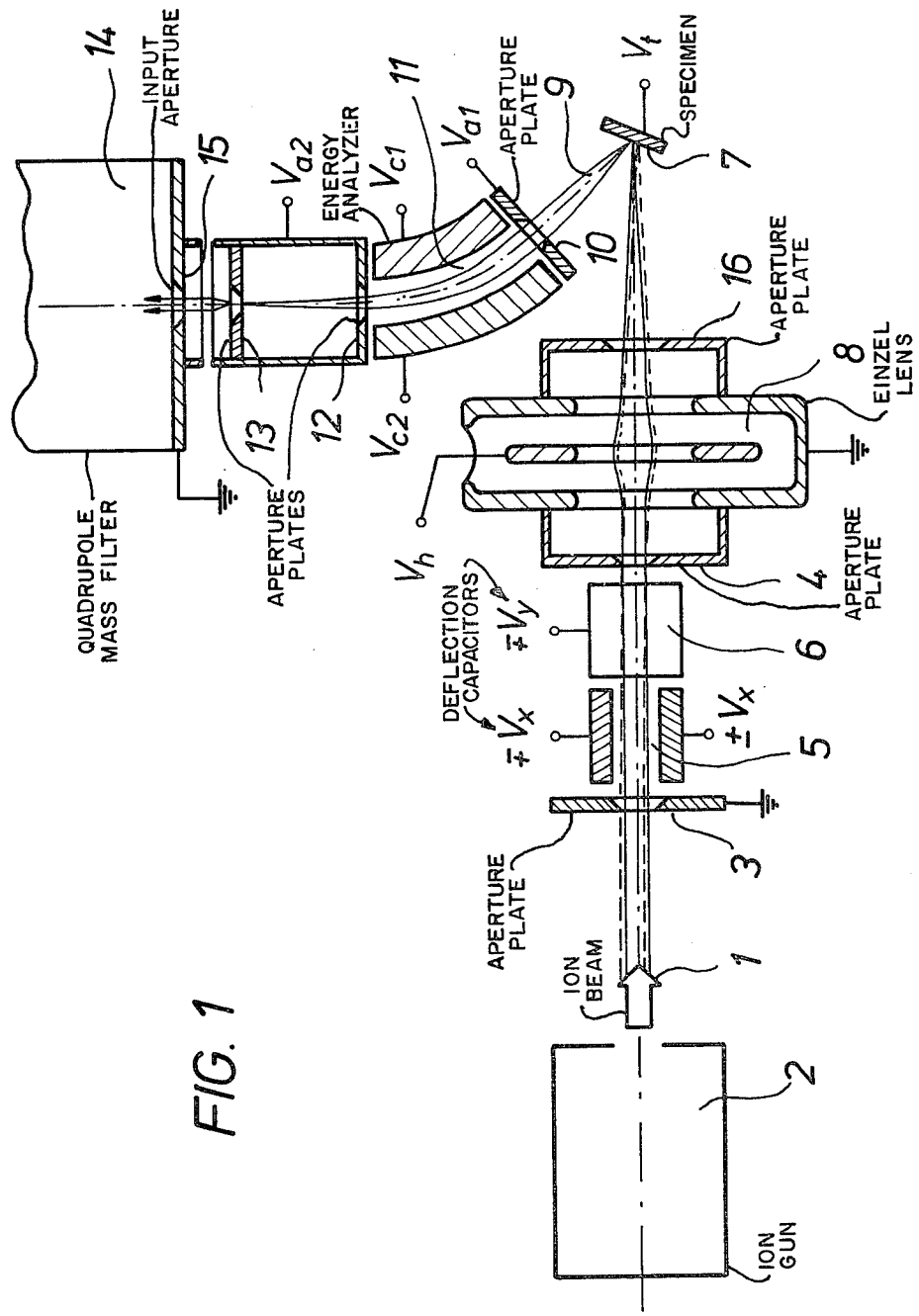
FIG. 1 is a schematic plan view of an exemplary embodiment of the raster scanning ion microscope according to the invention.

The exemplary embodiment of the invention shown in FIG. 1 is mounted in vacuum in a vessel which, for simplicity, is omitted in FIG. 1. A primary beam 1 of argon ions or other suitable ions with an energy of a few keV is produced by an ion gun 2. The ion gun 2 may be of standard design. For example, one can use the ion gun invented by F. Schulz and myself and disclosed in U.S. Pat. No. 3,911,314. The diameter of the primary ion beam 1 is defined by the apertures 3 and 4. Between these two apertures the beam passes through two plate capacitors 5 and 6, the plane of deflection of capacitor 5 being rotated by 90° with respect to that of capacitor 6. By feeding dc voltages $\pm V_{x,dc}$ and $\pm V_{y,dc}$ to the respective capacitor plates the primary ion beam 1 can be directed onto a selected point on the surface of the specimen 7. Raster scanning of the primary beam over the specimen surface is obtained by superimposing sawtooth voltages $V_{x,st}$ (frequency $f_x$) and $V_{y,st}$ (frequency $f_y$) upon $V_{x,dc}$ and $V_{y,dc}$, respectively, the line scanning pattern being determined by the ratio of the sawtooth frequencies, $f_x/f_y$. Both $V_{x,st}$ and $V_{y,st}$ may be generated by power supplies with either analog or digital output signals. The width of the raster scanned surface area can be controlled by adjusting the sawtooth voltages.

The raster scanned primary ion beam is focussed to a microspot on the specimen surface by feeding a high dc voltage $V_h$ to the center electrode of an electrostatic einzel lens 8.

By means of an aperture 10, a beam of secondary ions 9 is separated from the complete distribution emitted during bombardment. The secondary ion beam 9 can be accelerated by an electric field between specimen 7 at potential $V_t$ and aperture 10 at potential $V_{a1}$. Consequently the secondary ions experience an extraction voltage $V_{a1}-V_t$. If necessary, $V_t$ and $V_{a1}$ may be adjusted such that the secondary ions either do not experience acceleration or are even decelerated.

The secondary ion beam 9 is energy filtered by means of an energy analyzer 11 and apertures 12 and 13. A suitable part filtered out of the energy spectrum of the secondary ions is fed into a quadrupole mass filter 14 having an input aperture 15. Restrictions with respect to the layout of the energy analyzer do not exist. The cylindrical condenser shown in FIG. 1 is one example, the condenser plates being supplied with the dc voltages $V_{c1}$ and $V_{c2}$, respectively. In other embodiments of the invention one may use the energy filter invented by J. Maul, F. Schulz and myself and disclosed in U.S. Pat. No. 3,922,544.

In the embodiment of FIG. 1 the apertures 12 and 13 are supplied with the dc voltage $V_{a2}$. Usually $V_{a1} = V_{a2}$. In the electric field between aperture 13 and aperture 15, the energy analyzed secondary ions are decelerated before entering the quadrupole filter 14.

Suitable choice of the dc voltage $V_t$, $V_{a1}$, $V_{a2}$, $V_{c1}$ and $V_{c2}$ allows a matching of the emittance of the secondary ion beam 9 to the acceptance of the quadrupole filter 14. Introduction of additional lenses in the beam lines of primary and/or secondary ions does not change the basic concept of the raster scanning ion microscope according to the invention. The only effect is that the beam transport systems become more complex. Similarly, addition of a mass spectrometer for the primary ions does not change the main characteristic of the invention. A mass spectrometer for the primary ions may be useful when extremely clean analysis conditions are required.

An exemplary set of specific values for the voltages applied to the target and to an improved version of the energy filter disclosed in U.S. Pat. No. 3,922,544 is (for positive secondary ions): $V_t = 0$ to 15 volts (depending upon the secondary ion species studied) $V_{a1} = V_{a2} = -100$ volts, $V_{c1} = -150$ volts, $V_{c2} = -50$ volts at a plate length and plate separation in the energy filter of 30 mm and 20 mm, respectively.

Aperture 16 on the exit side of the einzel lens 8 does not define the primary ion beam. It serves to limit the extent of the electric field in the einzel lens such that this field does not affect the secondary ion extraction. Moreover it can be used to reduce target bombardment by scattered and neutral particles produced in the primary ion beam line.

Figure 2A:
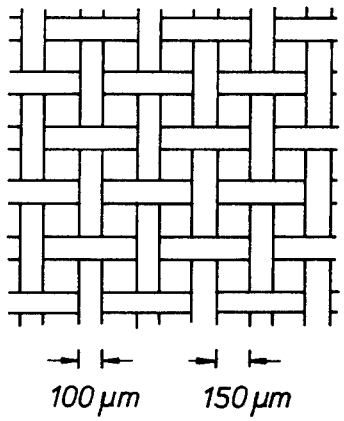
FIG. 2a ia a pictorial view of the pattern and the demensions of the steel fabric used as a test structure.
Figure 2B:
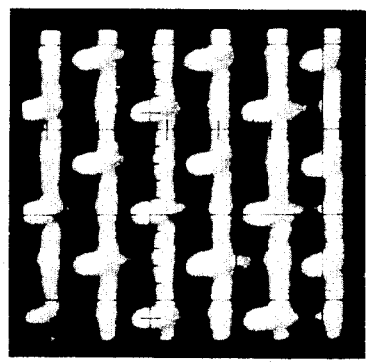
FIG. 2b is a pictorial representation of the corresponding ion image produced with the invention by monitoring $^{56}Fe^+$ secondary ions.

The capabilities of the raster scanning ion microscope according to the invention are demonstrated in FIGS. 2a and 2b. A wire gauze made from 100$\mu$ diameter steel wires was used as a specimen 7. This sample was bombarded with a focussed beam of 10 keV argon ions at a beam current of 10 nA. The diameter of aperture 4 was 0.5 mm, the distance between the exit of the einzel lens 8 and the specimen 7 was some 60 mm. The secondary ion beam 9 was energy filtered by an improved version of the device disclosed in U.S. Pat. No. 3,922,544.

FIG. 2a shows the braiding pattern of the gauze. The corresponding ion image is presented in FIG. 2b, which is a photographic reproduction of the intensity distribution displayed on an oscilloscope screen. It was obtained with the raster scanning ion microscope according to the invention while tuning the quadrupole mass filter to mass number 56. FIG. 2b thus reflects the lateral distribution of $^{56}$Fe on the specimen. The braiding pattern of the gauze is displayed clearly. The lateral resolution and the detection sensitivity are constant over the total area of 1.5 mm by 1.5 mm. From FIG. 2b and other images not shown one can deduce a lateral resolution of 10$\mu$ or better. The resolution may be improved, for example, by reducing the diameter of aperture 4 and/or by reducing the separation between einzel lens 8 and specimen 7.

Figure 3A:
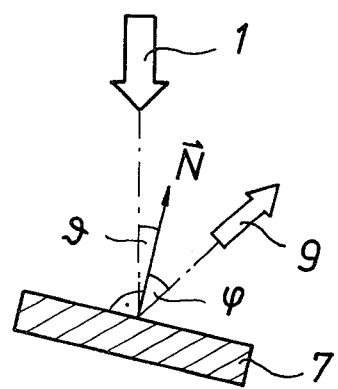
FIG. 3a is a view, on a macroscopic scale, illustrating the geometrically relevant bombardment and extraction parameters.
Figure 3B:
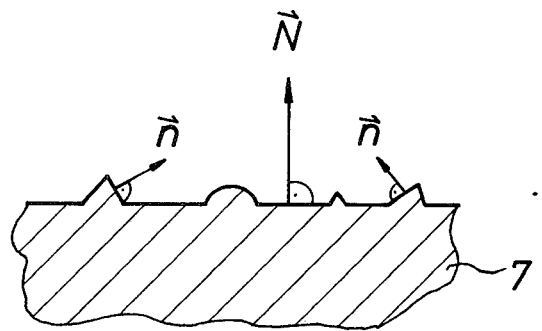
FIG. 3b is a view illustrating the same parameters as FIG. 3a, but on a microscopic scale.

FIG. 3 indicates the parameters relevant in bombardment of and secondary ion extraction from the specimen 7. FIG. 3a defines the angle of beam incidence, $\theta$, and the extraction angle, $\phi$, both measured from the macroscopic surface normal $\overline{N}$. FIG. 3b indicates, on an enlarged scale, the differences between $\overline{N}$ and the microscopic surface normal $\overline{n}$. The surface topography of the respective specimen is displayed most clearly in the raster scanning ion microscope according to the invention if at least one of the angles $\theta$ and $\phi$ is larger than zero and $\phi$ is preferably larger than 10°. FIG. 2a was taken at $\theta = 0°$ and $\phi \approx 40°$.

It will be understood that the above description of the present invention is susceptible to various modifications, changes and adaptations, and the same are intended to be comprehended within the meaning and range of equivalents of the appended claims.

What is claimed is:

1. In a raster scanning microscope for determining the lateral distribution of elements, isotopes and compounds at the surface and in the body of a solid specimen and composed of means to produce a primary ion beam, means positioned in the path of the primary ion beam to focus and raster scan the primary ion beam over such a specimen for producing by emission therefrom a secondary ion beam, an energy analyzer positioned in the path of the secondary ion beam, and a mass spectrometer disposed behind the energy analyzer in the path of the secondary ion beam for analysis thereof, the improvement wherein said mass spectrometer comprises a quadrupole filter.

2. Raster scanning microscope as claimed in claim 1 wherein said secondary ion beam is extracted by a voltage of less than 1 kV.

3. Raster scanning microscope as claimed in claim 2 wherein said secondary ion beam is extracted at an angle of more than 10° with respect to the surface normal of such a specimen.

4. Raster scanning microscope as claimed in claim 2 wherein the angle of incidence of the primary ion beam with respect to the surface normal of such a specimen is larger than 10°.

5. Raster scanning ion microscope for determining the lateral distribution of elements, isotopes and compound at the surface and in the body of a solid specimen, and for displaying the surface topography of said specimen comprising:
   (a) an ion gun for producing a primary ion beam;
   (b) at least one electrostatic lens positioned in the path of said primary ion beam to focus said primary ion beam on such a specimen;
   (c) means to raster scan said primary ion beam over the surface of such a specimen, for producing the emission of a secondary ion distribution;
   (d) an accelerating electrostatic lens positioned in the path of said secondary ion distribution for acceleration and imaging of said secondary ion distribution immediately subsequent to emission;
   (e) an electrostatic energy analyzer having an entrance aperture therein positioned in the path of said secondary ion distribution for separating a secondary ion beam from said secondary ion distribution;
   (f) a decelerating electrostatic lens for deceleration and imaging of said secondary ion beam disposed behind said energy analyzer; and
   (g) a quadrupole filter for mass analysis of said decelerated secondary ion beam, disposed behind said decelerating lens in the path of said secondary ion beam.

* * * * *